(12) United States Patent
Camarota

(10) Patent No.: US 10,502,785 B1
(45) Date of Patent: Dec. 10, 2019

(54) TEST NETWORK FOR A NETWORK ON A CHIP AND A CONFIGURATION NETWORK

(71) Applicant: Xilinx, Inc., San Jose, CA (US)

(72) Inventor: Rafael C. Camarota, San Jose, CA (US)

(73) Assignee: XILINX, INC., San Jose, CA (US)

( * ) Notice: Subject to any disclaimer, the term of this patent is extended or adjusted under 35 U.S.C. 154(b) by 121 days.

(21) Appl. No.: 15/799,673

(22) Filed: Oct. 31, 2017

(51) Int. Cl.
*G01R 31/00* (2006.01)
*G01R 31/3185* (2006.01)
*G01R 31/3183* (2006.01)
*G01R 31/317* (2006.01)

(52) U.S. Cl.
CPC ........... *G01R 31/318519* (2013.01); *G01R 31/31717* (2013.01); *G01R 31/318378* (2013.01)

(58) Field of Classification Search
None
See application file for complete search history.

(56) References Cited

U.S. PATENT DOCUMENTS

| | | | | |
|---|---|---|---|---|
| 7,328,286 B2 * | 2/2008 | Vinnemann | ........... | H04L 12/403 710/113 |
| 7,383,478 B1 * | 6/2008 | Ballagh | ............... | G01R 31/3025 370/338 |
| 2007/0113123 A1 * | 5/2007 | Crouch | ................... | H04L 45/60 714/724 |
| 2010/0223505 A1 * | 9/2010 | Andreev | ............. | G06F 11/3668 714/37 |
| 2016/0182405 A1 * | 6/2016 | Chen | ..................... | H04L 49/109 370/353 |
| 2016/0205066 A1 * | 7/2016 | Attarwala | ............... | H04L 12/40 709/208 |
| 2017/0228481 A1 * | 8/2017 | Pusuluri | .............. | G06F 17/5077 |
| 2018/0198687 A1 * | 7/2018 | Rao | ......................... | H04L 41/16 |
| 2019/0089619 A1 * | 3/2019 | Yeager | .................... | H04L 43/50 |

OTHER PUBLICATIONS

U.S. Appl. No. 15/588,321, filed May 5, 2017, Camarota, Rafael C. et al., Xilinx, Inc.,San Jose, CA USA.

* cited by examiner

*Primary Examiner* — Daniel F. McMahon
(74) *Attorney, Agent, or Firm* — Carleton Clauss

(57) ABSTRACT

A network on a chip (NoC) testing interface (NTI) includes a plurality of switches whose ports are coupled to respective endpoints. In one embodiment, the ports and endpoints are coupled to a shared bus that starts and terminates at a root device. The endpoints are assigned unique address which the NTI uses to select one of the endpoints so that test data is forwarded to a device under test (DUT) coupled to the endpoint. In one embodiment, the endpoints include selection logic for determining whether the endpoint has been selected, and if so, forwarding test data to the DUT. For example, if the endpoint receives a data vector on the bus which has an address that matches the unique address of the endpoint, the selection logic forwards the test data contained in subsequently received data vectors to the DUT until a different address is received.

18 Claims, 9 Drawing Sheets

| | Auto Address Mode | Scan Test Mode | | |
|---|---|---|---|---|
| | 0 | 1 | | |
| nti_cntl_test_aag | | | | |
| nti_scan_mode_rst_n | | | | |
| nti_scan_clock_n | | | | |
| nti_port_out_0 | N/A | nti_clk | nti_clk | nti_clk |
| nti_port_out_1 | N/A | A/D=1 | A/D=0 not selected | A/D=0 selected |
| nti_port_out_2 | Address 0 | Address 0 | Feedthru Test Datain 0 | DUT Test Dataout 0 |
| nti_port_out_3 | Address 1 | Address 1 | Feedthru Test Datain 1 | DUT Test Dataout 1 |
| nti_port_out_4 | Address 2 | Address 2 | Feedthru Test Datain 2 | DUT Test Dataout 2 |
| nti_port_out_5 | Address 3 | Address 3 | Feedthru Test Datain 3 | DUT Test Dataout 3 |
| nti_port_out_6 | Address 4 | Address 4 | Feedthru Test Datain 4 | DUT Test Dataout 4 |
| nti_port_out_7 | Address 5 | Address 5 | Feedthru Test Datain 5 | DUT Test Dataout 5 |
| nti_port_out_8 | Address 6 | Address 6 | Feedthru Test Datain 6 | DUT Test Dataout 6 |
| nti_port_out_9 | Address 7 | Address 7 | Feedthru Test Datain 7 | DUT Test Dataout 7 |
| nti_port_out_10 | Address 8 | Address 8 | Feedthru Test Datain 8 | DUT Test Dataout 8 |
| nti_port_out_11 | N/A | slave Address 0 | Feedthru Test Datain 9 | DUT Test Dataout 9 |
| nti_port_out_12 | N/A | slave Address 1 | Feedthru Test Datain 10 | DUT Test Dataout 10 |
| nti_port_out_13 | N/A | slave Address 2 | Feedthru Test Datain 11 | DUT Test Dataout 11 |
| nti_port_out_14 | N/A | Feedthru nti_scan_en_n | Feedthru nti_scan_en_n | Feedthru nti_scan_en_n |
| nti_port_out_15 | N/A | Feedthru nti_edt_update_n | Feedthru nti_edt_update_n | Feedthru nti_edt_update_n |
| | N/A | Feedthru nti_cssd_trigger_n | Feedthru nti_cssd_trigger_n | Feedthru nti_cssd_trigger_n |

FIG. 6

TEST NETWORK FOR A NETWORK ON A CHIP AND A CONFIGURATION NETWORK

TECHNICAL FIELD

Examples of the present disclosure generally relate to a network on a chip (NoC) and, in particular, to testing devices forming the NoC using a test network.

BACKGROUND

Programmable integrated circuits (e.g., a field programmable gate array (FPGA), programmable logic device (PLD)) can contain a packet network structure known as a network on a chip (NoC) which is programmed using a network referred to herein as a NoC configuration network (NCN). The NCN includes multiple switches which route packets between configurable logic. The NoC and the NCN are complex packet protocol networks spread through the PLD which makes testing these networks difficult.

SUMMARY

Techniques for testing devices in an integrated circuit are described. One example is an integrated circuit that includes a network on a chip (NoC), a root device, a plurality of switches each comprising a plurality of ports, and a plurality of endpoints coupled to an ingress port and an egress port of a respective one of the plurality of switches via a bus where the bus starts and terminates at the root device. The integrated circuit includes a plurality of devices under test (DUT), each coupled to a respective one of the plurality of endpoints. Each of the plurality of endpoints is assigned a respective unique address and is configured to in response to receiving a first address data vector on the bus that contains the unique address, forward test data received in a first test data vector to a first DUT of the plurality of DUTs and transmit resulting data received from the first DUT to a downstream endpoint using the bus and in response to receiving a second address data vector on the bus that does not contain the unique address, forward test data received in a second test data vector to the downstream endpoint using the bus.

One example described herein is a method of testing an integrated circuit comprising a plurality of switches each comprising a plurality of ports and a plurality of endpoints coupled to an ingress port and an egress port of a respective one of the plurality of switches via a bus where the bus starts and terminates at a root device. The method includes receiving, using the bus, a first address data vector at a first endpoint of the plurality of endpoints, determining that the first address data vector contains a unique address assigned to the first endpoint, forwarding test data received in a first test data vector to a DUT coupled to the first endpoint where the first address data vector and the first test data vector are in a first packet, transmitting, using the bus, resulting data received from the DUT from the first endpoint to a second endpoint of the plurality of endpoints, receiving, using the bus, a second address data vector at the first endpoint, determining that the second address data vector does not contain the unique address assigned to the first endpoint, and forwarding, using the bus, test data received in a second test data vector to the second endpoint, wherein the second address data vector and the second test data vector are in a second packet.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIG. 6 is a chart defining an example protocol for operating a NoC test interface, according to an example.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
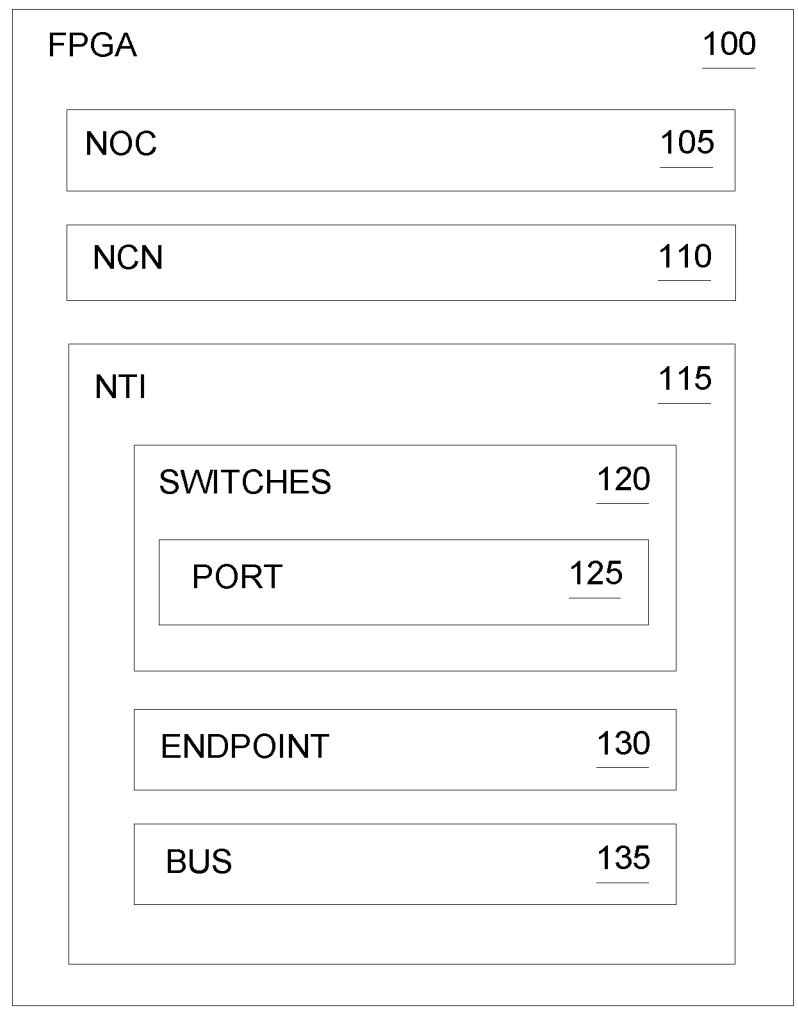
FIG. 1 is a block diagram of an FPGA containing a NoC and a NCN, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe a NoC test interface (NTI) for testing a NoC which, in one embodiment, is programmable. The NTI includes a plurality of switches whose ports are coupled to respective endpoints. In one embodiment, the ports and endpoints are coupled to a shared bus that starts and terminates at a root device. The endpoints are assigned unique address which can be used to select one of the endpoints so that test data transmitted on the shared bus is forwarded to a device under test (DUT) coupled to the selected endpoint. In one embodiment, the endpoints include selection logic (e.g., a multiplexer or mux) for determining whether the endpoint (or the corresponding DUT) has been selected, and if so, forwarding test data to the DUT. For example, during one cycle, the endpoint receives a data vector on the bus which contains an address. If the address matches the unique address of the endpoint, the selection logic forwards the test data contained in data vectors received in subsequent cycles to the DUT until a different address is received. If the address does not match, the selection logic forwards the test data received in the subsequent cycles to the next port or endpoint without sending the test data to DUT. In this manner, the NTI can select a particular DUT (or DUTs) for testing during each cycle.

FIG. 1 is a block diagram of an FPGA 100 containing a NoC, a NCN, and a NTI, according to an example. The NoC 105 is a communication subsystem that provides communication between various endpoints (e.g., hardware elements such as processors, memory, digital-to-analog converters, I/O ports, and the like) in the FPGA 100. In one embodiment, the NCN 110 is a switching network which programs the NoC 105. That is, the NCN 110 can alter the manner in which the NoC 105 provides communication between endpoints in the FPGA 100. To do so, the NCN 110 includes switches that each include multiple ports (not shown) which can couple to configuration memories which store configuration information for configuring the NoC 105 and other elements of the FPGA 100. That is, the data stored in the configuration memories by the NCN 110 determines the configuration of the switches of the NoC 105 and other elements connected to the NoC 105. These configuration memories are also referred to as endpoints.

In one embodiment, the NTI 115 tests the NoC 105 and the NCN 110. To route test data (and receive results) to the various devices or components to be tested (referred to generally as DUTs), the NTI 115 includes switches 120, endpoints 130 and a bus 135. The switches 120 each include multiple ports 125 which couple the endpoints 130 using the bus 135. In one embodiment, the switches 120 and the bus 135 may also be used by the NCN 110 to perform auto address generation. That is, the NTI 115 and the NCN 110 may share the same switches 120 and bus 135, but this is not a requirement. However, in one embodiment, the endpoints 130 used by the NTI 115 are different from the endpoints (or configuration memories) in the NCN 110. For example, the endpoints 130 may include selection logic for identifying address data transmitted on the bus 135 and determining if the corresponding test data is intended to the DUT connected to the endpoint 130. In one embodiment, each of the endpoints 130 is assigned a unique address.

The bus 135 may include a plurality of parallel bit lines (e.g., 16 lines or wires) for transmitting address data and test data to the endpoints 130. Each cycle, the bus 135 may transmit a data vector using the parallel bit lines that can include an address or test data. For example, the NTI 115 may transmit and address data vector which includes an address for a desired target endpoint 130 followed by one or more test data vectors which include test data to be transmitted to the DUT coupled to the target endpoint 130. These data vectors (i.e., the data vector containing the address and the data vector(s) containing the test data) are referred to herein as a packet. In this manner, the data vector with the address is referred to as the header of the packet. Once the target endpoint 130 receives the address, the endpoint 130 determines if it should forward the test data received in the subsequent test data vectors to the connected DUT. When non-intended target endpoints 130 receive the data vectors, these endpoints 130 forward the test data onto the next endpoint 130 without sending the test data to their connected DUTs.

Although the embodiments herein describe using the NTI 115 for configuring a programmable NoC 105 in the FPGA 100, the embodiments are not limited to such and can be used in any programmable IC. Further still, in other embodiments, the testing techniques described below can be used to test a NoC 105 on a non-programmable IC such as an ASIC. A NoC 105 on a non-programmable IC may be programmable as described above or could be non-programmable such the network configuration of the NoC 105 cannot be changed (e.g., the switches in the NoC remain coupled to the same switches and endpoints as when the IC was fabricated). In one embodiment, a non-programmable IC does not include a NCN 110 since the configuration of the NoC 105 in the IC cannot be changed. Although the NCN 110 and NTI 115 are shown as being separate from the NoC 105, in one embodiment, the NCN 110 and NTI 115 can be considered part of the NoC 105.

Figure 2:
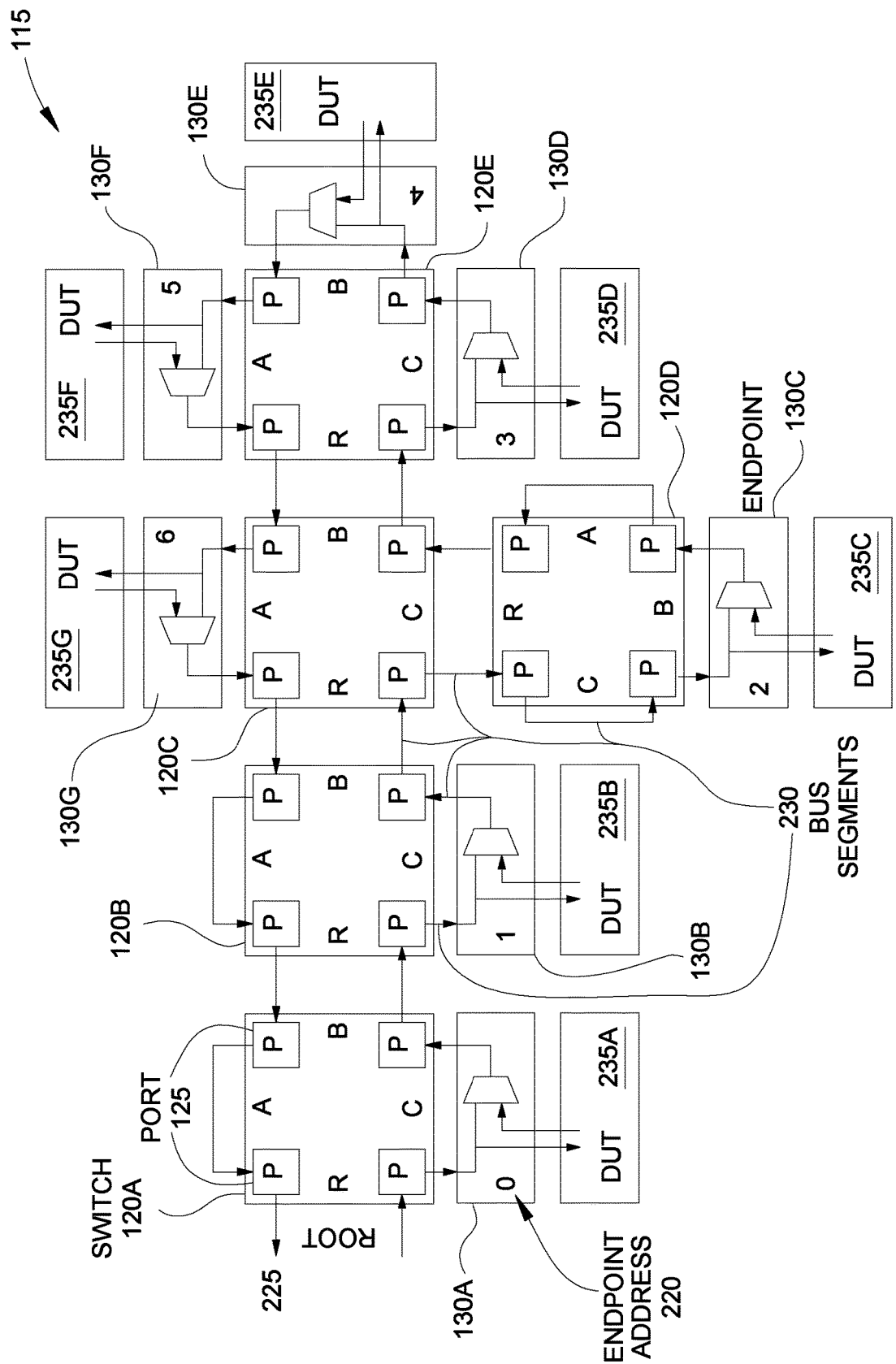
FIG. 2 illustrates a NoC test interface, according to an example.

FIG. 2 illustrates a NTI 115, according to an example. The NTI 115 includes switches 120A-120E, endpoints 130A-130G, and DUTs 235A-235G. The ports 125 in each of the switches 120 are coupled to either one of the endpoints 130 or another port 125 in the same or different switch 120 using a bus segment 230. Similarly, each of the endpoints 130 is coupled to an ingress port 125 and an egress port 125 on the same switch 120 using respective bus segments 230. Collectively, the bus segments 230 from the bus 135 described in FIG. 1 which starts and terminates at a root device 225. That is, a first bus segment 230 connects the root device 225 to a port 125 in the switch 120A. From there, a second bus segment 230 connects that same port in the switch 120A (e.g., the ingress port) to the endpoint 130A while a third bus segment 230 connects the endpoint 130B to a different port in the switch 120A (e.g., the egress port). A fourth bus segment 230 couples that port in the switch 120A to a port in the switch 120B. In this manner, the bus segments 230 form a bus that snakes around the NTI 115 so each of the endpoints 130 are connected in sequential manner (e.g., a chain) until the bus terminates back at the root device 225.

As shown, each of the endpoints 130 is assigned a unique endpoint address 220. That is, the endpoint 130A has an address "0", the endpoint 130B has an address "1", and so forth. In this manner, each of the endpoints 130 is uniquely addressable. Thus, when the root device 225 transmits the address "3" on the bus which eventually reaches the endpoint 130D, the endpoint 130D determines that the test data transmitted in the subsequent data vectors should be forwarded to the coupled DUT—i.e., the DUT 235D. However, when the other endpoints 130 receive that data vector, because they have different endpoint addresses 220, these endpoints 130 forward along the data vectors without transmitting the test data contained therein to their connected DUTs 235.

The endpoints 130 can both transmit test data into the DUTs 235 and read resulting test data out of the DUTs 235. For example, the test data transmitted into the DUT 235 may propagate through registers and other logic in the DUT 235 before resulting data is then transmitted from the DUT 235 to the endpoint 130. The endpoint can then forward the resulting data on the bus to the next endpoint 130 which then continue to forward the resulting data (without modifying it or sending it to their DUTs 235) until it reaches the root device 225. To determine if the DUT 235 is functioning correctly, the root device 225 can compare the resulting data to expected data, and if it matches, confirm that the corresponding DUT 235 is functioning properly.

Figure 3:
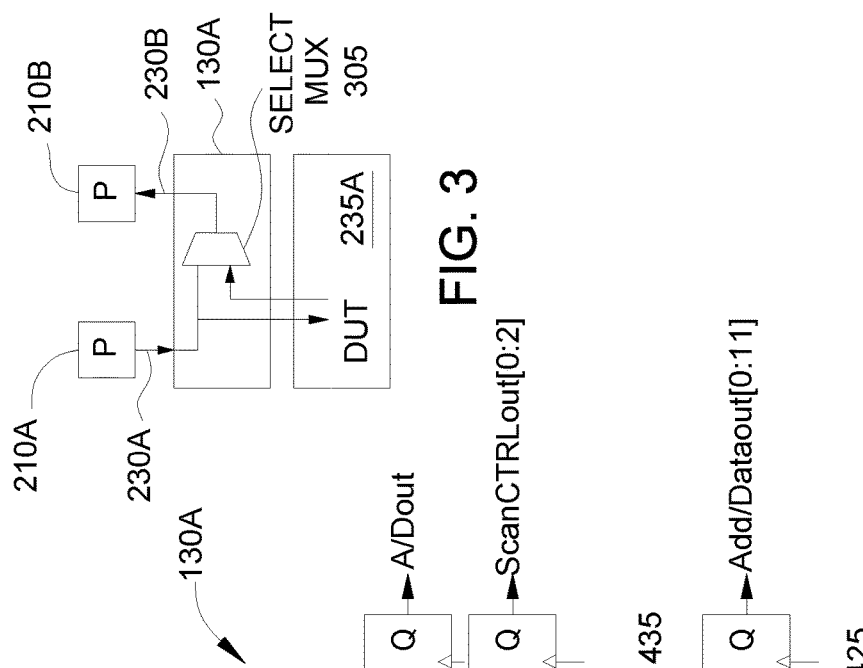
FIG. 3 illustrates an endpoint in a NoC test interface, according to an example.

FIG. 3 illustrates the endpoint 130A in the NTI, according to an example. That is, FIG. 3 illustrates a close up of the endpoint 130A and DUT 235A shown in FIG. 2. As shown, the endpoint 130A is coupled to an ingress port 210A which transmits data vectors along a bus segment 230A to the endpoint 130A. If the data vector includes an endpoint address, the endpoint 130A can compare the received address to its previously assigned address to determine if they match. If so, the endpoint 130A knows the data vectors received subsequently (e.g., the data vectors received until another address is received) contain test data that should be forwarded to the DUT 235A (e.g., an input/output (I/O) bank).

The endpoint 130A includes a select mux 305 (e.g., selection logic) which determines whether the data received from the ingress port 210A is forwarded to an egress port 210B using a bus segment 230B. If the data vector includes an address, in one embodiment, the select mux 305 always forwards this data vector to the egress port 210B (and on to subsequent endpoints 130) without changing the bits or data in the data vector. If the data vector contains test data intended for the DUT 235A, instead of forwarding the test data to the port 210B, the endpoint 130A transmits the test data to the DUT 235A and the select mux 305 forwards resulting data received from the DUT 235A to the port 210B. For example, a packet may contain eight data vectors. During a subset of the eight cycles, the endpoint 130A forwards the test data to the DUT 235A and the select mux 305 replaces the test data with resulting data received from the DUT 235A. Put differently, for at least some of the cycles, the resulting data received from the DUT 235A, and not the test data received from the port 210A, is forwarded onto the port 210B and the next endpoint 130. However, if the data vector contains test data not intended for the DUT 235A, the select mux 305 forwards that same data vector (without changing the test data) to the port 210B. In one embodiment, the endpoint 130 uses control signals to ensure the test data is not loaded into registers in the DUT 235A if it is not the intended target—i.e., the DUT 235A ignores the received test data.

Figure 4:
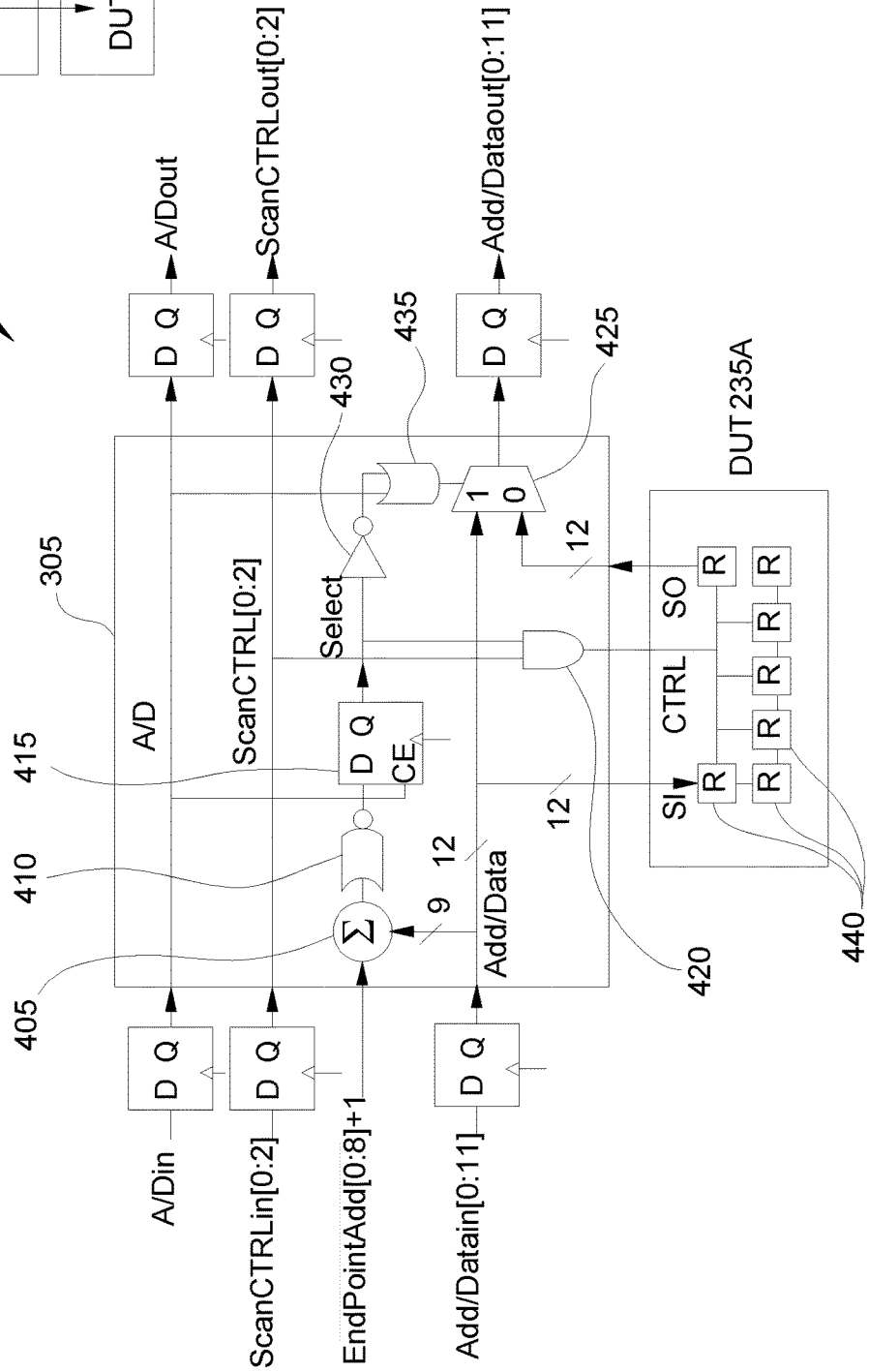
FIG. 4 illustrates selection logic in an endpoint of a NoC test interface, according to an example.

FIG. 4 illustrates selection logic (i.e., the select mux 305) in the endpoint 130A of an NTI, according to an example. The left signals—i.e., A/Din, ScanCTRLin[0:2], and Add/Datain[0:11]—indicate different data bits received from the ingress port 210A on the bus segment 230A (not shown). However, the signal BAR(EndPointAdd[0:8])+1 is not a signal received from the ingress port 210A but rather is the two's complement version of the endpoint address 220 assigned to the endpoint 130A. As shown in FIG. 2, the endpoint address 220 of the endpoint 130A is "0", thus, in binary, the two's complement of this address would be "000000000" in this example since the endpoint address 220 includes nine bits. Although not shown, the two's complement (or the actual endpoint address 220) may be stored in a register in the endpoint 130A. Thus, the two's complement is readily available to the select mux 305 in order to determine if a received address matches the endpoint address 220.

In FIG. 4, the address data is received using the Add/Datain[0:11] signal. As shown, the first nine bits of this signal—i.e., [0:8]—are routed to a summer 405 which adds the received address—i.e., bits [0:8] of the Add/Datain signal—to the two's complement of the endpoint address 220—i.e., BAR(EndPointAdd[0:8])+1. If there is a match (i.e., the address in the received data vector is the assigned address of the endpoint 130A), the output of the summer 405 is all zeros. That is, adding a binary number by its two's complement, results in all zeros. The output of the summer 405 is sent to a NOR gate 410 which only outputs a one if all its inputs are zeros or outputs a zero otherwise.

The output of the NOR gate 410 is coupled to a latch 415 which is triggered in response to the A/Din signal. In one embodiment, the state of the A/Din signal indicates whether the bits in the Add/Datain signal are for an address or test data. For example, if the A/Din signal is a one (e.g., a first logical state), the Add/Datain is an address. If the A/Din signal is a zero (e.g., a second logical state), the Add/Datain is test data. Thus, the latch 415 only stores (i.e., latches) the data sent by the NOR gate 410 when the A/Din signal is a one indicating the Add/Datain signal represents an address. If the A/Din signal is a zero indicating the Add/Datain signal represents test data, the output of the NOR gate 410 is not stored in the latch 415 regardless of its value.

The output of the latch 415 is a Select signal which is the input of an inverter 430 and an AND gate 420. The output of the AND gate 420 is a control signal which determines whether registers 440 in the DUT 235A store the data transmitted on the Add/Datain signals. Anytime the Select signal is a zero (i.e., the address data for the packet does not match the address of the endpoint 130A), the AND gate 420 prevents the registers 440 from storing the test data in the Add/Datain signals.

In one example, assume in the previous cycle the Add/Datain signal included an address which matched the address of the endpoint 130A. As a result, the output of the latch 415 is a one. In the current cycle, the Add/Datain signal includes test data that should be stored in the registers 440. As such, the bits of the ScanCTRLin signals are ones, which, because the Select signal is also a one, activates the registers 440 such that the first register of the registers 440 latches the test data in the Add/Datain signal and the outputs of the registers 440 transfer to the subsequent registers in the scan chain. In this manner, the test data is latched into, and can propagate through, the registers 440 in the DUT 235A.

Although not shown, the registers 440 in the DUT 235 can couple to other DUTs 235. For example, using a previous packet, the NTI may have loaded test data into a different DUT which has a register that couples to an input of one of the registers 440 in the DUT 235A. In this packet, the NTI activates the registers 440 such that the registers 440 latch data that was loaded into a different DUT during a previous packet. Thus, using a serious of packets, the NTI can load test data into one DUT which is then transferred into one or more other DUTs before being outputted as resulting data that is loaded onto the bus.

In addition to activating the registers 440, the Select signal also determines whether the test data received in the Add/Datain signal or resulting data received from the last register of the registers 440 in the DUT 235A is forwarded onto the bus segment 230B to the egress port 210b (and on to the next endpoint 130 or the root device). To do so, the Select signal is inverted by an inverter 430. For example, if the endpoint is currently selected for testing, the inverter 430 outputs a zero which is inputted to an OR gate 435 along with the A/Din signal. In the example mentioned above, the A/Din signal is a zero if test data, rather than address data, is currently being transmitted by the Add/Datain signal. Thus, when the endpoint 130A is selected for testing and the A/Din signal is a zero, then both inputs to the OR gate 435 are zero. The output of the OR gate 435 is the select signal for a first mux 425 which either forwards the Add/Datain signals or the output of the last register in the DUT 235A to the egress port 210b. When the output of the OR gate 435 is a zero, the mux 425 outputs the values stored in the last register of the DUT 235A. That is, if the Add/Datain signal currently has test data (and the endpoint 130A is selected), the first mux 425 replaces the test data with resulting data received from the DUT 235A. Thus, the downstream endpoints in the NTI receive the resulting data rather than the test data.

However, if the Add/Datain signal has test data but the endpoint 130A is not selected (e.g., the DUT 235A is not currently being tested), the mux 425 outputs the Add/Datain signals. Put differently, the select mux 305 forwards the same test data it received to the next endpoint 130. Of course, if the endpoint 130A is not the first endpoint on the bus, the received test data may actually be resulting data generated by a DUT connected to an upstream endpoint. In any case, the select mux 305 forwards the resulting data or test data on to the next endpoint without changing the data.

If the Add/Datain signal has address data, then the A/Din signal is a one which forces the output of the OR gate 435 to a one thereby forwarding the Add/Datain signals to the egress port 210B. That is, the address data is simply forwarded to the next endpoint which is done regardless whether the address matches the address of the endpoint 130A. Moreover, the ScanCTRL signals and the A/Din signals are outputted to the next endpoint 130A without being modified.

Figure 5:
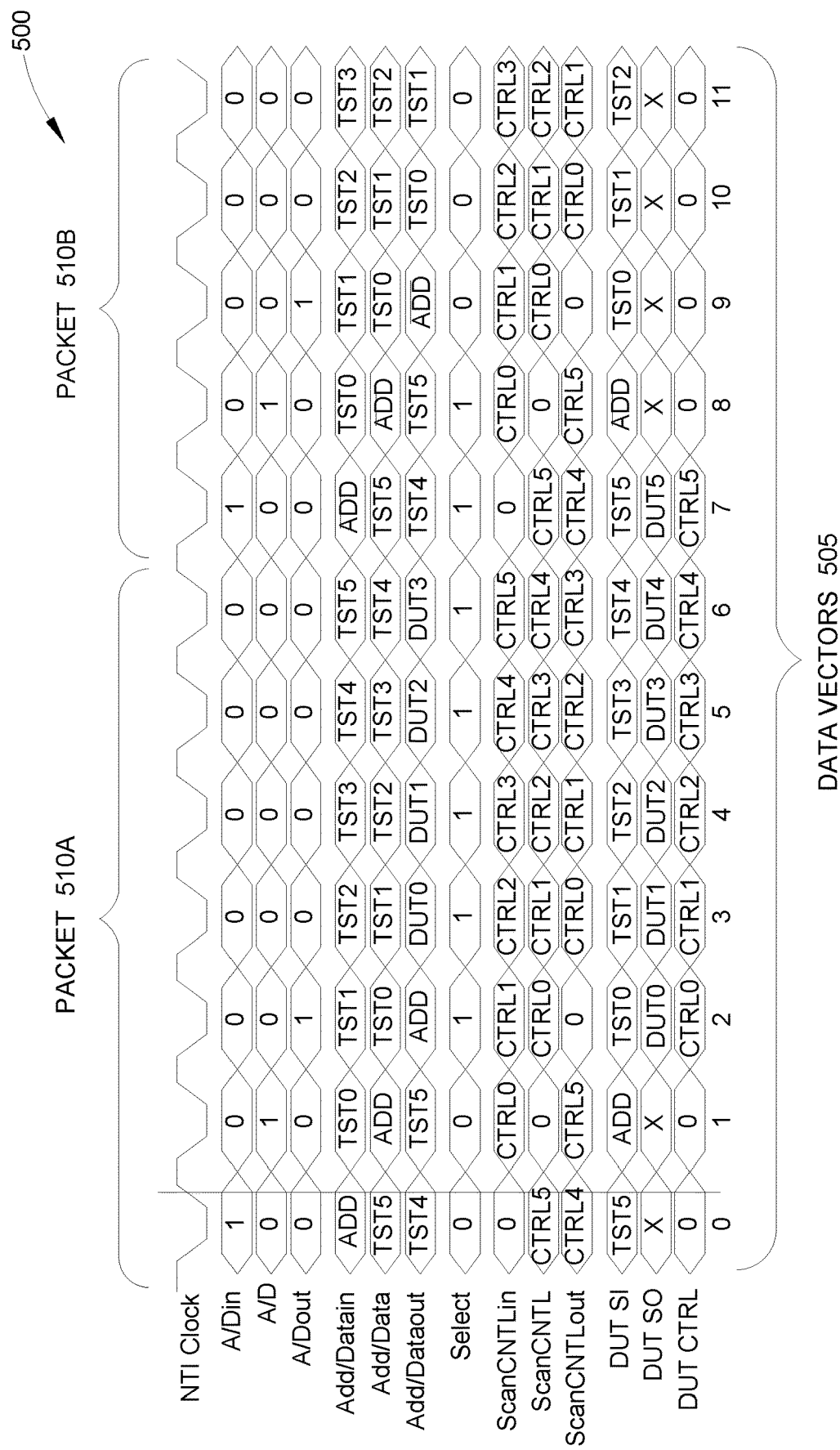
FIG. 5 is a chart illustrating address and test data transmissions in a NoC test interface, according to an example.

FIG. 5 is a chart 500 illustrating address and test data transmissions in NTI, according to an example. For ease of explanation, the data signals listed on the vertical axis of chart 500 are the same signals shown in the endpoint 130A of FIG. 4. The horizontal axis lists different data vectors 505 (e.g., Data Vectors 0-11) indicating the state of the various signals on the bus during bus cycles 0-11.

As shown, Data Vector 0 is contains address data as indicated by the A/Din signal being a one. As mentioned above, a data vector containing address data can be considered as a header for a packet as well as a tail for the previous packet. In this example, Data Vector 0 and Data Vector 7 both contain an address, and thus, are headers for packet 510A and packet 510B. In this example, ADD provided in the Add/Datain signal is the address of the endpoint 130A corresponding to chart 500. As such, the test data in the subsequent data vectors is forwarded to the DUT 235A coupled to the endpoint 130A. For example, during Data Vectors 1-6, the endpoint 130A forwards the test data TST0, TST1, TST2, etc. to the DUT. In Data Vector 2, the endpoint 130A forwards the address data ADD but during Data Vectors 3-6 the endpoint 130A forwards the resulting data DUT0, DUT1, DUT2, etc. received from the DUT to the next endpoint in the NTI.

However, the address data for the next packet 510B does not match the address of endpoint 130A. This is represented by the NOT (or BAR) ADD received during Data Vector 7. In this case, the endpoint 130A forwards the test data TST0, TST1, etc. received in packet 510б on to the next endpoint of the NTI. That is, the data received in the Add/DataIn signal is the same as the data transmitted (albeit with a delay) in the Add/DataOut signal.

FIG. 6 is a chart 600 defining an example protocol for operating a NTI, according to an example. The chart 600 illustrates the behavior of the endpoints 130 in the NTI during different scenarios. The first column illustrates the different lines or bits in the bus (e.g., nti_port_out_0-15). The second column illustrates when the bus is used for auto address generation which is described in more detail below. The third column illustrates the values of the lines in the bus when transmitting an address data vector. Here, the line nti_port_out_0 is the A/D signal (which indicates if the data vector has address data or test data) while the lines nti_port_out_1-9 are the address data. In this embodiment, the lines nti_port_out_10-12 provide address data for a sub-address (or slave address) for testing different sub-systems coupled to the same endpoint. The lines nti_port_out_13-15 are the control signals (i.e., ScanCNTRL). These line assignments remain the same regardless of the type of data vector being sent when in the scan test mode.

The fourth column illustrates the values of the lines in the bus when transmitting test data that is not intended for the DUT coupled to the endpoint. In this example, the endpoint forwards the test data on to the next endpoint as indicated by the Feedthru Test Datain 0-11 signals. Moreover, the A/D signal on the line nti_port_out_0 is switched to zero.

The fifth column illustrates the values of the lines in the bus when transmitting test data that is intended for the DUT coupled to the endpoint. When receiving a previous address vector, the endpoint changed its state to selected. In this case, the endpoint loads resulting data received from the DUT (i.e., DUT Test Dataout0-11) onto the lines nti_port_out 1-12 which is sent to the next endpoint in the NTI. Put differently, the endpoint does not forward on the received test data, but instead replaces this data with resulting data received from a coupled DUT.

Figure 7:
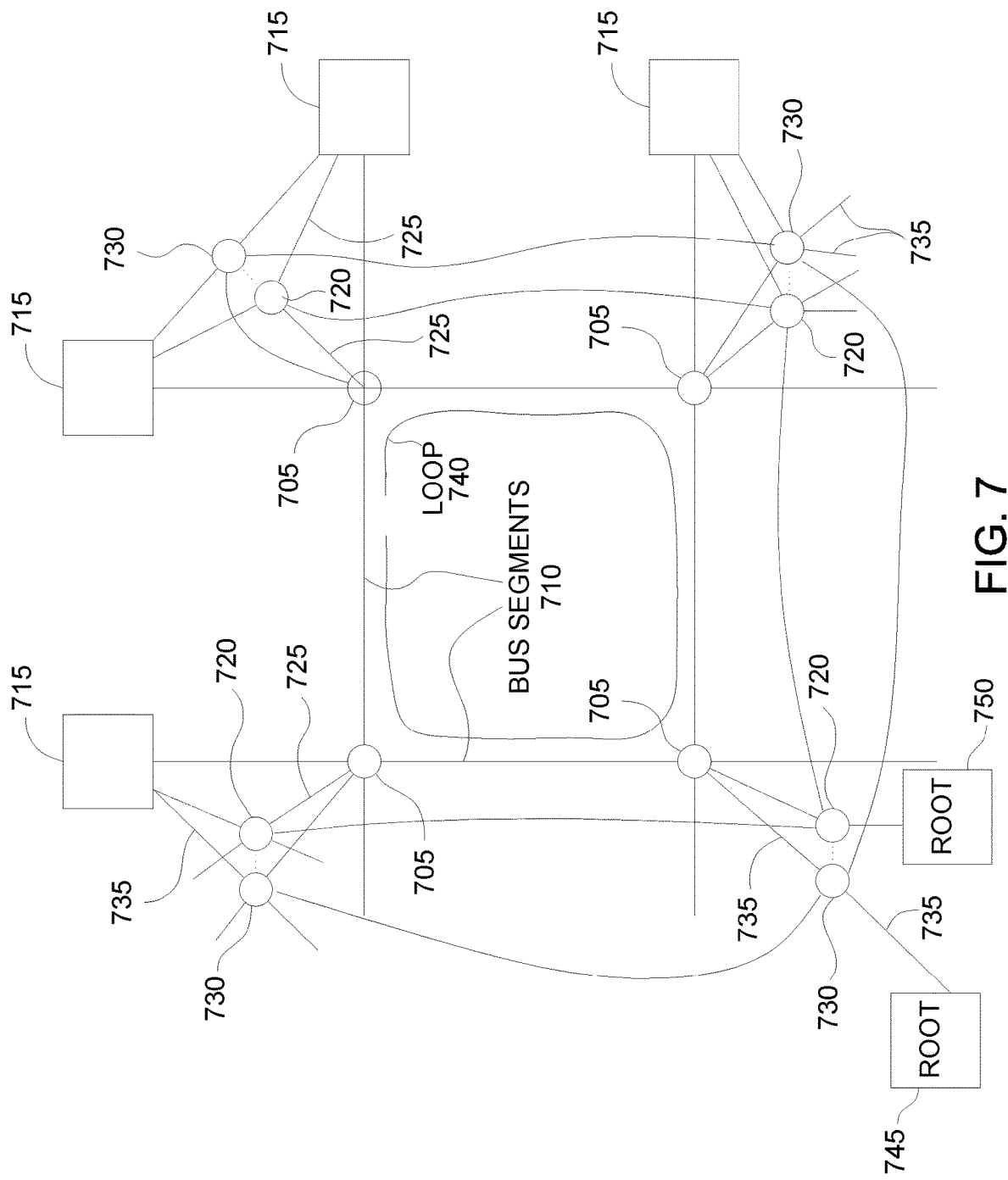
FIG. 7 illustrates a NoC, NCN, and NoC test interface, according to an example.

FIG. 7 illustrates a NoC, NCN, and NTI, according to an example. The components in the NoC programmable network are illustrated using solid lines. The NoC programmable network includes NoC switches 705 that are interconnected via bus segments 710. Moreover, the bus segments 710 couple the NoC switches 705 to peripheral elements 715 which can include the root device, memory elements, memory controllers, I/O banks, programmable logic fabric, and the like. The NoC switches 705 can be complex and the bus segments 710 can include hundreds of wires. In one embodiment, the NoC (e.g., the NoC switches 705 and bus segments 710) has many loops 740 and redundant paths and requires configuration to resolve these loops and enable specific paths and virtual channels.

The components in the NCN are illustrated using dashed lines and include NCN switches 720 that are connected to the peripheral elements 715 and the NoC switches 705 using bus segments 725. Each of the NCN switches 720 include an endpoint represented by the bus segments 725 terminating at the NoC switches 705 and the peripheral elements 715. These endpoints are used to program configuration registers or memory in the respective peripheral elements 715. Moreover, the NCN switches 720 may be less complex than the NoC switches 705 of the NoC and the bus segments 725 may have fewer lines than the bus segments 710 of the NoC.

The components in the NTI are represented using dotted lines and include NTI switches 730 (e.g., the switches 120 in FIGS. 1 and 2) that are connected to the peripheral elements 715, the NCN switches 720, and the NoC switches 705 using bus segments 735. Like the NCN, each of the NTI switches 730 is coupled to an endpoint represented by the bus segments 735 terminating at the NoC switches 705 and the peripheral elements 715. The endpoints in the NTI are used to test the peripheral elements 715, the NCN switches 720, and the NoC switches 705 as described above (referred to collectively as DUTs). In one embodiment, the NTI network tests the NoC programmable network, the NCN fixed (i.e., non-programmable) network, the peripheral elements 715, and any other device coupled to an endpoint in the NTI. In comparison, the NTI switches 730 are simple relative to the NoC switches 705 and the NCN switches 720, and the bus segments 735 can be much smaller than the bus segments 710 and 725 (e.g., sixteen wires instead of hundreds of wires).

In one embodiment, the NCN and NTI are fixed networks which have a single root, no loops (i.e., no loops 740) and all leaves, whether used or un-used, have an endpoint or a loopback. In one embodiment, the NCN and NTI have respective roots (e.g., root 745 and root 750) which may be the same location or have different locations. Nonetheless, the NCN and NTI may have a one-to-one switch and endpoint correspondence, except each of the NTI switches 730 has one extra endpoint to test the NCN switch 720 and its connected endpoints. In one embodiment, the NoC has no predefined root device. Instead, when configuring the NoC, a root or roots is defined along with active switches, peripherals, and bus segments.

Figure 8:
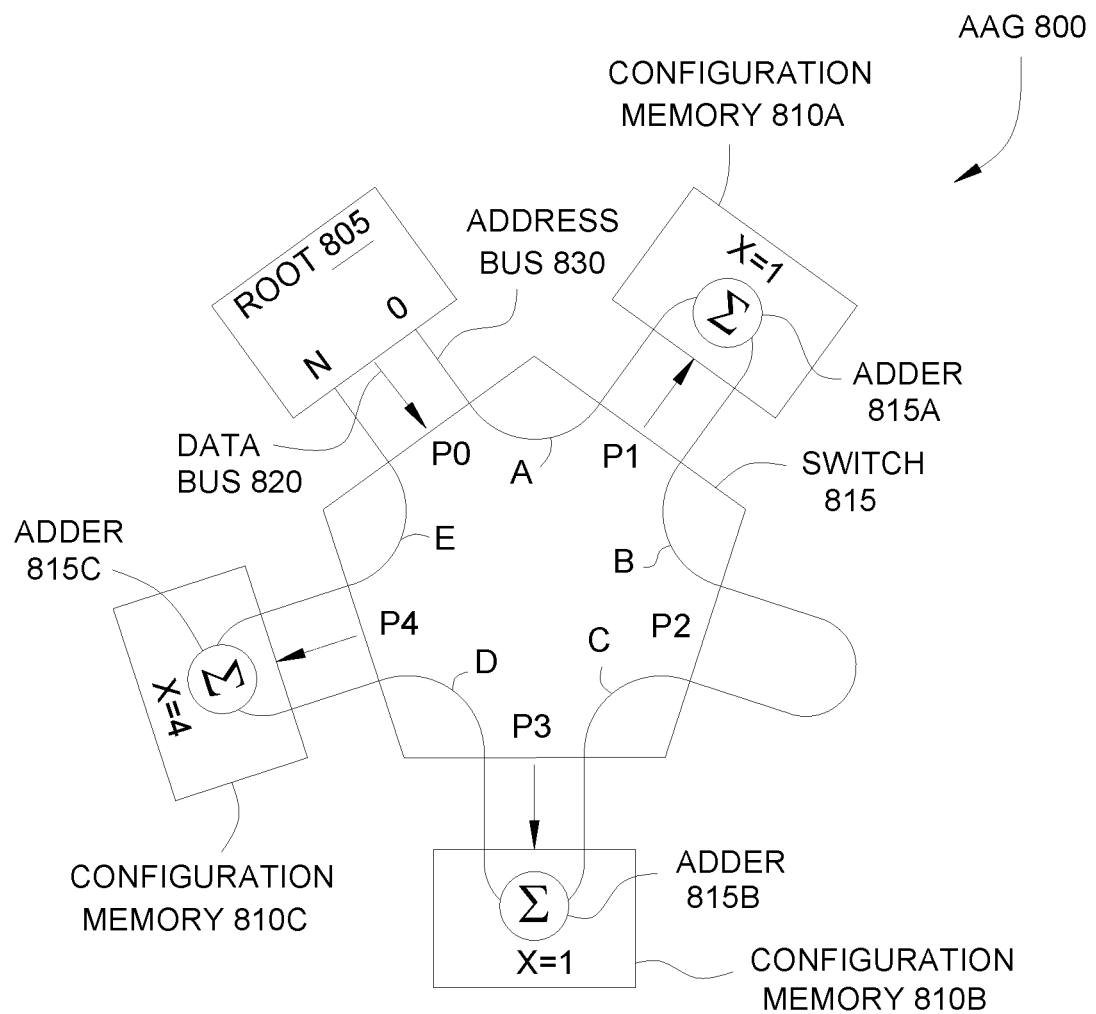
FIG. 8 illustrates auto address generation in a NCN using a parallel address bus, according to an example.

FIG. 8 illustrates auto address generation (AAG) 800 in a NCN using a parallel address bus, according to an example. As shown, the AAG 800 includes a root device 805 which has a start port (labeled "0") which is the starting point for the address bus 830 and a termination port (labeled "N") which is the termination point of the address bus 830. The root device 805 may include driver circuitry to drive a beginning segment of the address bus 830—i.e., a segment connecting the root device 805 to the switch 815. In this example, the start port of the address bus 830 outputs a value of zero for the address bus 830.

In addition to the address bus 830, a data bus 820 also couples the root device 805 to the switch 815. Using the data bus 820, the root device 805 can transmit data packets to the switch 815 which forwards these packets to configuration memories 810 or to other NCN switches (not shown in FIG. 8) based on the address ranges assigned to the ports P1-P4. The switch 815 includes logic for routing the data packets to any number of configuration memories 810 which can configure the peripheral elements 715 illustrated in FIG. 7. To do so, the ports labeled P1-P4 use different data bus segments as shown by the dotted arrows. As mentioned above, the ports P1-P4 are assigned unique addresses or address ranges in order to route the packets to the intended destination, i.e., the intended configuration memory 810.

To assign addresses to the ports and the configuration memory 810, the address bus 830 is routed through the switch 815 to each of its ports P1-P4. In this embodiment, the address bus 830 includes respective segments (i.e., an egress segment and an ingress segment) that connect the ports of the switch 815 to configuration memories 810. The bus address segments extend from Nodes A-E in the switch 815 to the configuration memory. As used herein, a "node" is a sample point on the address bus 830 that is used to set the address range of a corresponding port (e.g., P1-P4) in the switch 815. The egress segment of the address bus 830 for port P1 extends from Node A in switch 815 to configuration memory 810A while the ingress segment of the bus 830 for port P1 extends from the configuration memory 810A to Node B in the switch 815. However, each port does not need to couple to a configuration memory 810. In this example, port P2 is not coupled to a configuration memory 810 and thus the address bus 830 at port P2 is a short circuit between Node B and Node C in the switch 815.

In one embodiment, at startup, the root device 805 drives voltages on the address bus 830 that correspond to an initial address value—e.g., zero. These voltages are then forwarded by the switch 815 to the configuration memory 810A, and more specifically, to an adder 815A in the configuration memory 810A. The adder 815A increments the value on the address bus according to a predefined address range value "X". For example, the size of the memory in the configuration memories 810 may vary, and thus, the address range assigned to the ports of the switch 815 coupled to these memories 810 can vary accordingly. In FIG. 8, the configuration memories 810A and 810B have address range values of 1 while the configuration memory 810C has an address range value of 4 indicating that the address range assigned to the configuration memory 810C should be four times larger than the address ranges assigned to the configuration memories 810A and 810B. In one embodiment, the address range represents blocks of memory. For example, an address value of one can represent a single memory block of 64 KB while a value of four represents four blocks of 64 KB of memory.

The adder 815A increases the value on the address bus 830 which is then driven on the segment of the bus 830 coupled to Node B of the switch 815. In turn, the switch 815 can identify the address range for port P1 (and the configuration memory 810A) by comparing the value of the address bus segments 830 at Node A and at Node B. In this embodiment, the adder 815A increases the value of the address bus 830 from zero to one.

Figure 9:
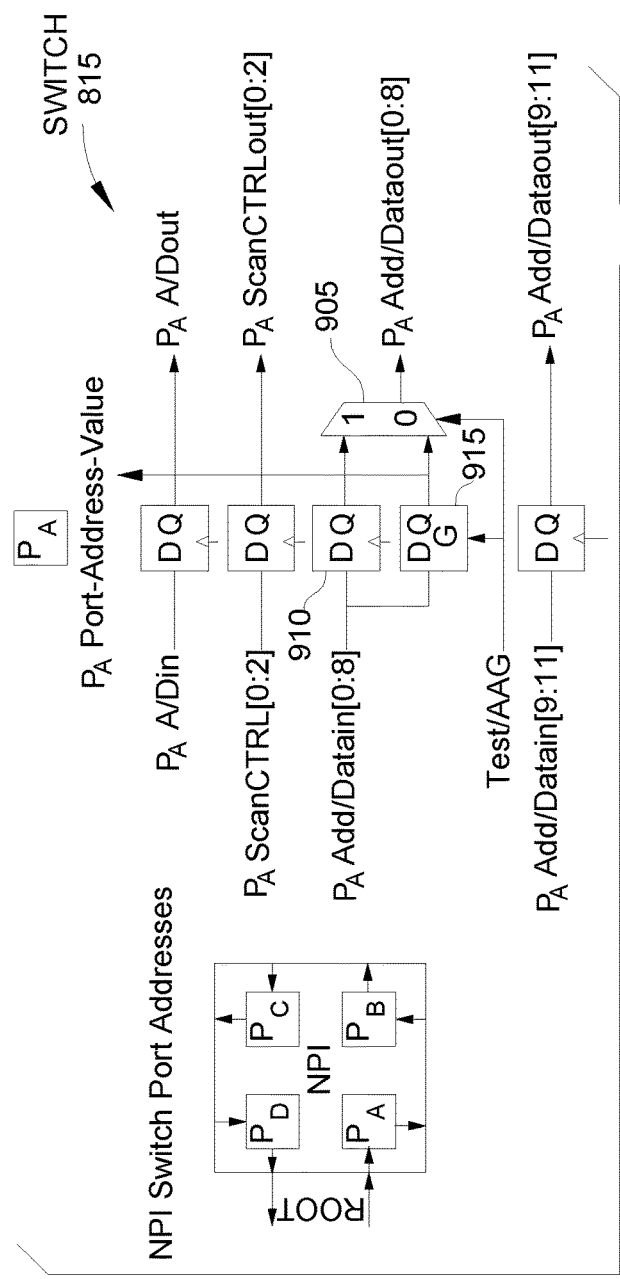
FIG. 9 illustrates modifying a NoC test interface to implement auto address generation, according to an example.

FIG. 9 illustrates modifying a NTI to implement auto address generation, according to an example. That is, FIG. 9 illustrates modifying the switch 815 in the NTI (e.g., an NTI switch) so that a shared bus can be used when performing AAG as shown in FIG. 8 and when testing the DUTs using the NTI. In one embodiment, the shared bus follows the protocol illustrated in chart 600 of FIG. 6 where the Auto Address Mode corresponds to performing auto address generation and the Scan Test Mode corresponds to testing the DUTs.

In FIG. 9, the NTI port pipeline registers in the switch 815 include a register 910 that receives a portion of the Add/Datain signal (e.g., bits [0:8]), which includes the assigned address when performing auto address and the address/test data when testing the DUTs. Moreover, the Add/Datain signal is also fed into a latch 915. In one embodiment, the latch 915 is a hardened latch or single event upset (SEU) tolerant latch to mitigate potential errors that may occur from SEU events.

The switch 815 also includes a test/AAG signal that controls when the latch 915 captures the data in the Add/Datain signal. When in AAG mode (e.g., the Test/AAG signal is zero), a mux 905 forwards the data outputted by the latch 915. When the Test/AAG signal is a zero, latch 915 is in flow through mode (which stores the assigned address of the switch 815). When in the test mode (e.g., the Test/AAG signal is one), the mux 905 forwards the data outputted by the register 910 (which stores the address data or test data in the data vectors shown in FIG. 5). The latch 915 captures the AAG address before entering the test mode. Regardless of the value of the Test/AAG signal, the output of the latch 915 is the Port-Address-Value used by the NCN switches and endpoints along with the NTI switches and endpoints.

Figure 10:
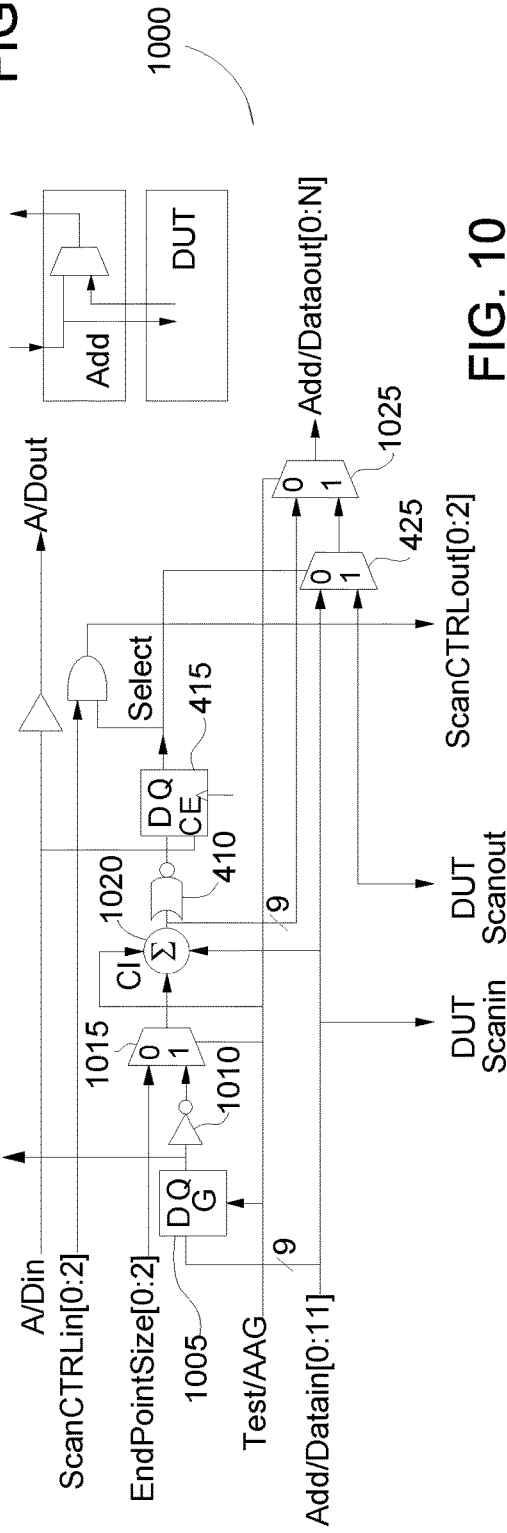
FIG. 10 illustrates an endpoint in a NoC test interface for implementing auto address generation, according to an example.

FIG. 10 illustrates an endpoint 1000 in a NCN for implementing a NTI, according to an example. In one embodiment, the endpoint 1000 is the endpoint 130 used by the NTI to test a coupled DUT.

The endpoint 1000 includes a first latch 1005 which receives the first eight bits of the Add/Datain signal and is controlled or clocked by the Test/AAG signal. In one embodiment, the first latch 1005 is a hardened or SEU tolerant latch. Similar the latch 915 in FIG. 9 that stores the assigned address for the NCN switch 815, the first latch 1005 stores the assigned address of the endpoint 1000 (e.g., the EndPointAddress Value). The assigned address is stored in the latch 1005 when the Test/AAG value indicates that the Test mode is selected. Put differently, the first latch 1005 latches (i.e., saves) the AAG port address when in the test mode but is in a flow through mode when performing AAG.

The output of the first latch 1005 is sent to an inverter 1010 and then to a mux 1015. When testing the DUT, the mux 1015 forwards the inverted address to a summer 1020 which outputs the two's compliment of the address of the endpoint 1000 by adding the inverted address to a carry input (CI) bit with a value of one. The two's complement of the address of the endpoint 1000 is then used to activate the Select signal as discussed in FIG. 4 using the NOR gate 410 and the latch 415.

Further, the endpoint 1000 includes an output mux 1025 coupled to the mux 425 used to select the Add/Datain signals or resulting data from the DUT. The output mux 1025 selects the output of the summer 1020 when performing AAG and selects the output of the mux 425 when testing the DUT. Although not shown, the output mux 1025 may only control a portion of the Add/Data bus—e.g., bits [0:8] but not bits [9:11].

When performing AAG, the summer 1020 adds the Add/Datain[0:8] pins to the EndPointSize[0:2] values which represents the address range of the endpoint (i.e., the X value shown in FIG. 8). When testing the DUT, the assigned address value of the endpoint (or the associated port address value of the NCN switch) is latched. The summer 1020 compares the Add/Data[0:8] bits to the two's complement of the assigned address when the A/Din signal is a one. Either the Add/Datain[0:11] or the DUT Scanout[0:11] value is outputted to the Add/Dataout[0:11] bus depending on the value of the Select signal. In this manner, a shared bus can be used to perform AAG for the NCN and testing a DUT (or DUTs) using the NTI.

Figure 11:
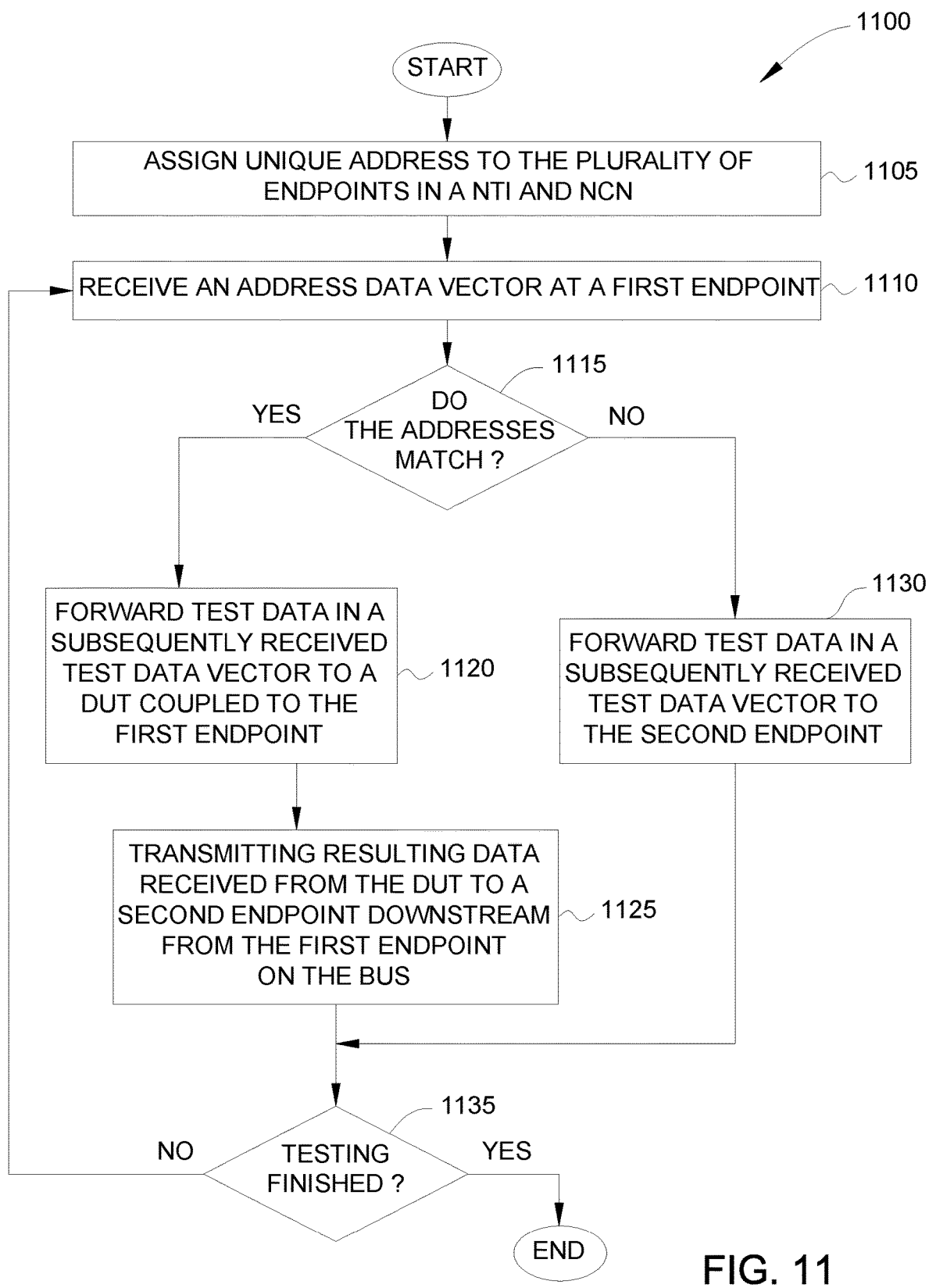
FIG. 11 is a flowchart for testing an integrated circuit using a NoC test interface, according to an example.

FIG. 11 is a flowchart of a method 1100 for testing an integrated circuit using a NTI, according to an example. The method 1100 begins at block 1105 where unique addresses are assigned to the plurality of endpoints in the NTI and NCN. This could be done manually (i.e., by the system designer when designing the integrated circuit) or automatically by, for example, using the auto address generation techniques described in FIGS. 8-10.

At block 1110, a first endpoint of the plurality of endpoints receives an address data vector (e.g., a data vector that contains one of the unique addresses assigned to plurality of endpoints). The first endpoint may receive the address data vector from an upstream endpoint (i.e., an endpoint coupled between the first endpoint and the root device on the bus) or directly from the root device—i.e., without the data vector passing through any upstream endpoint.

At block 1115, the first endpoint uses selection logic (e.g., the select mux 305 shown in FIGS. 3 and 4) to determine whether the address in the address data vector matches the unique address assigned to the first endpoint. If so, the method 1100 proceeds to block 1120 where the selection logic in the first endpoint forwards test data in a subsequently received test data vector to a DUT coupled to the first endpoint. For example, the address data vector received at block 1110 may be a header for a packet that contains one or more test data vectors that are received by the first endpoint during subsequent bus cycles. Instead of containing an address, the test data vectors contain test data used to test the DUT coupled to the first endpoint. In one embodiment, the selection logic in the first endpoint instructs one or more registers in the DUT to load and process the test data.

At block 1125, the first endpoint transmits resulting data received from the DUT to a second endpoint downstream from the first endpoint on the bus. That is, the first endpoint may receive resulting data from the DUT resulting from processing the test data loaded into the DUT during previous bus cycles. This resulting data is then transmitted on the bus to the downstream endpoints until reaching the root device. The downstream endpoints continue to forward the resulting data unchanged since the address for that packet does not match their own addresses.

If at block 1115 the address in the address data vector does not match the address of the first endpoint, the method 1100 proceeds to block 1130 where the first endpoint forwards test data in the subsequently received test data vector to the second downstream endpoint. Thus, unlike in block 1125, the first endpoint forwards the same test data it received down the chain of endpoints. An endpoint down the chain that does have a matching address can then forward the test data to its coupled DUT.

At block 1135, the method 1100 determines if testing is finished—e.g., whether the root device sent another test packet that can include an address vector followed by one or more data vectors. If not, the method 1100 returns to block 1110 to determine if the new test packet has an address data vector with an address that matches the first endpoint. If not, the method 1100 ends.

Moreover, in one embodiment, the NTI does not require any Fabric elements or NoC elements to be programmed to test the integrated circuit. A Platform Management Controller (PMC) (also referred to as a Platform Manager) in the integrated circuit may use external firmware to orchestrate the tests. In one embodiment, the NTI permits full functional testing of any block on the NPI network without the use of programmable logic (PL) fabric or boundary logic interface (BLI) connections. Put differently, the NTI is a hard connection that does not rely on programming. The PL fabric and BLI connections typically do not operate before they are programmed and even the NoC may not work until it is programmed or configured. When the integrated circuit is first powered on, the PL fabric, BLI connections, and the NoC may not be programmed and configured, and thus, cannot be used to test the hardware blocks in the integrated circuits. However, the NTI can be used which, like the PMC which is the lowest level first on processor sub-system, is operational once the integrated circuit is powered on.

As functional safety becomes more important, the NTI is an effective tool for performing "Key-on" test of the NoC and periphery elements which are used in many safety critical industries such as the automobile industry and autonomous industrial systems (e.g., large robots and self-driving cars). The intelligence of the processor can orchestrate the testing. The processor can self-identify and test the network with element specific standard vectors stored in non-volatile memory.

In one embodiment, the "Key-on" test includes powering-up the integrated circuit and loading NoC test firmware using a processor. The processor can search the NPI address space for elements requiring power-up testing and identify the block type for those elements by reading an identifier stored in the NPI address space. Using the NTI network described above, the processor can run a test routine using a block identifier to test sub-routing look-up table. The test can continue until all the elements required for safe operation have been tested. If all the elements pass their respective tests, the integrated circuit is functional and normal operation can begin.

While the foregoing is directed to specific examples, other and further examples may be devised without departing from the basic scope thereof, and the scope thereof is determined by the claims that follow.

What is claimed is:

1. An integrated circuit, comprising:
a network on a chip (NoC); and
a root device;
a plurality of switches each comprising a plurality of ports;
a plurality of endpoints coupled to an ingress port and an egress port of a respective one of the plurality of switches via a bus, wherein the bus starts and terminates at the root device;
a plurality of devices under test (DUT), each coupled to a respective one of the plurality of endpoints, wherein each of the plurality of endpoints is assigned a respective unique address and is configured to:
in response to receiving a first address data vector on the bus that contains the unique address, forward first test data received in a first test data vector to a first DUT of the plurality of DUTs and transmit resulting data received from the first DUT to a downstream endpoint using the bus; and
in response to receiving a second address data vector on the bus that does not contain the unique address, forward second test data received in a second test data vector to the downstream endpoint using the bus,
wherein each of the plurality of endpoints comprises a select mux configured to toggle a logical state of a select signal based on comparing the unique address to address data in the first and second address data vectors.

2. The integrated circuit of claim 1, wherein each of the plurality of endpoints is configured to, in response to determining the second address data vector on the bus does not contain the unique address, control the first DUT such that the second test data received in the second test data vector is ignored by the first DUT.

3. The integrated circuit of claim 1, wherein the second test data that is forwarded to the downstream endpoint is the same as the second test data received in the second test data vector.

4. The integrated circuit of claim 1, wherein the resulting data transmitted to the downstream endpoint is different from the first test data received in the first test data vector.

5. The integrated circuit of claim 1, wherein the first address data vector and the first test data vector are part of a first packet transmitted using multiple bus cycles of the bus and the second address data vector and the second test data vector are part of a second packet transmitted using multiple bus cycles of the bus.

6. The integrated circuit of claim 1, wherein the plurality of endpoints comprises a first mux configured to select between the resulting data received from the first DUT and first test data based on the logical state of the select signal, wherein an output of the first mux is forwarded to the downstream endpoint.

7. An integrated circuit, comprising:
a network on a chip (NoC); and
a root device;
a plurality of switches each comprising a plurality of ports;
a plurality of endpoints coupled to an ingress port and an egress port of a respective one of the plurality of switches via a bus, wherein the bus starts and terminates at the root device;
a plurality of devices under test (DUT), each coupled to a respective one of the plurality of endpoints, wherein each of the plurality of endpoints is assigned a respective unique address and is configured to:
in response to receiving a first address data vector on the bus that contains the unique address, forward first test data received in a first test data vector to a first DUT of the plurality of DUTs and transmit resulting data received from the first DUT to a downstream endpoint using the bus; and
in response to receiving a second address data vector on the bus that does not contain the unique address, forward second test data received in a second test data vector to the downstream endpoint using the bus,
wherein the first and second address data vectors and the first and second test data vectors each contain respective control bits, wherein the respective control bits are forwarded to the downstream endpoint without being changed.

8. The integrated circuit of claim 7, wherein at least one of the plurality of ports in each one of the plurality of switches is coupled to a different switch using the bus.

9. The integrated circuit of claim 1, further comprising:
a NoC configuration network (NCN) for configuring the NoC, wherein the NCN is configured to perform auto address generation to assign the unique addresses to the plurality of endpoints.

10. The integrated circuit of claim 9, wherein the NCN uses the bus when performing the auto address generation, wherein each of the plurality of endpoints comprises a summer configured to generate a two's complement version of the unique address when testing the first DUT and add an endpoint size value to a received address when performing auto address generation, wherein the endpoint size value represents a predefined address range assigned to each of the plurality of switches.

11. The integrated circuit of claim 1, wherein the integrated circuit is a programmable integrated circuit and the NoC is a programmable NoC.

12. The integrated circuit of claim 1, wherein the integrated circuit is a non-programmable integrated circuit.

13. A method of testing an integrated circuit comprising a plurality of switches each comprising a plurality of ports and a plurality of endpoints coupled to an ingress port and an egress port of a respective one of the plurality of switches via a bus, wherein the bus starts and terminates at a root device, the method comprising:
receiving, using the bus, a first address data vector at a first endpoint of the plurality of endpoints;
determining that the first address data vector contains a unique address assigned to the first endpoint;
forwarding first test data received in a first test data vector to a DUT coupled to the first endpoint, wherein the first address data vector and the first test data vector are in a first packet;
transmitting, using the bus, resulting data received from the DUT from the first endpoint to a second endpoint of the plurality of endpoints;
receiving, using the bus, a second address data vector at the first endpoint;
determining that the second address data vector does not contain the unique address assigned to the first endpoint;
forwarding, using the bus, second test data received in a second test data vector to the second endpoint, wherein the second address data vector and the second test data vector are in a second packet; and toggling a logical state of a select signal in the first endpoint based on comparing the unique address to address data in the first and second address data vectors.

14. The method of claim 13, further comprising:
in response to determining that the second address data vector does not contain the unique address, controlling the DUT such that the second test data received in the second test data vector is ignored by the DUT.

15. The method of claim 13, further comprising:
selecting between the resulting data received from the DUT and the first test data based on the logical state of the select signal.

16. The method of claim 13, wherein the first and second address data vectors and the first and second test data vectors each contain respective control bits, the method further comprises:
forwarding the respective control bits to the second endpoint without changing the respective control bits.

17. The method of claim 13, further comprising:
performing auto address generation using the bus to assign unique addresses to the plurality of endpoints.

18. The method of claim 17, further comprising:
generating a two's complement version of the unique address when testing the DUT using a summer; and
adding, using the summer, an endpoint size value to a received address when performing auto address generation, wherein the endpoint size value represents a predefined address range assigned to each of the plurality of switches.

* * * * *